(12) United States Patent
Hu

(10) Patent No.: US 11,869,904 B2
(45) Date of Patent: Jan. 9, 2024

(54) ARRAY SUBSTRATE, METHOD FOR FABRICATING SAME, AND DISPLAY DEVICE

(71) Applicant: Shenzhen China Star Optoelectronics Semiconductor Display Technology Co., Ltd., Guangdong (CN)

(72) Inventor: Xiaobo Hu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 570 days.

(21) Appl. No.: 17/048,819

(22) PCT Filed: Aug. 5, 2020

(86) PCT No.: PCT/CN2020/107079
§ 371 (c)(1),
(2) Date: Oct. 19, 2020

(87) PCT Pub. No.: WO2022/016618
PCT Pub. Date: Jan. 27, 2022

(65) Prior Publication Data
US 2023/0163146 A1     May 25, 2023

(30) Foreign Application Priority Data
Jul. 20, 2020 (CN) .......................... 202010697170.5

(51) Int. Cl.
*H01L 27/12* (2006.01)
*H01L 25/16* (2023.01)
*H01L 23/00* (2006.01)

(52) U.S. Cl.
CPC .......... *H01L 27/1288* (2013.01); *H01L 24/03* (2013.01); *H01L 24/05* (2013.01);
(Continued)

(58) Field of Classification Search
CPC ......... H01L 24/03; H01L 24/05; H01L 24/08; H01L 25/167; H01L 25/16;
(Continued)

(56) References Cited

U.S. PATENT DOCUMENTS 8,796,741 B2 * 8/2014 Gu ...................... H01L 27/0688
257/29
10,070,083 B2 * 9/2018 Konstantatos .... H01L 27/14632
(Continued)

FOREIGN PATENT DOCUMENTS

CN     102769030 A     11/2012
CN     105762086 A     7/2016
(Continued)

OTHER PUBLICATIONS

Chinese Office Action issued in corresponding Chinese Patent Application No. 202010697170.5 dated Mar. 5, 2023, pp. 1-7.

*Primary Examiner* — Nikolay K Yushin

(57) ABSTRACT

An array substrate, a method for fabricating the same, and a display device are provided. The method includes: forming a passivation layer on an array substrate, wherein the array substrate includes a thin film transistor and a conductive pad, and the passivation layer covers the thin film transistor and the conductive pad; forming a full-surface carbon film on the passivation layer; and patterning the carbon film and the passivation layer to remove the passivation layer and the carbon film corresponding to the conductive pad by a patterning process to obtain the array substrate.

19 Claims, 3 Drawing Sheets

(52) U.S. Cl.
CPC ........ *H01L 25/167* (2013.01); *H01L 27/1248* (2013.01); *H01L 24/08* (2013.01); *H01L 2224/03614* (2013.01); *H01L 2224/03622* (2013.01); *H01L 2224/05567* (2013.01); *H01L 2224/08145* (2013.01); *H01L 2924/12041* (2013.01)

(58) Field of Classification Search
CPC ............. H01L 25/0567; H01L 27/1288; H01L 27/1248; H01L 27/1262; H01L 27/1259; H01L 2224/03614; H01L 2224/03622; H01L 2224/05567; H01L 2224/08145; H01L 2924/12041
See application file for complete search history.

(56) References Cited

U.S. PATENT DOCUMENTS

| | | | |
|---|---|---|---|
| 10,290,622 B2 * | 5/2019 | Li | H01L 24/83 |
| 10,892,169 B2 * | 1/2021 | Or-Bach | H01L 23/49827 |
| 10,964,722 B2 * | 3/2021 | Xia | H01L 27/156 |
| 2006/0278902 A1 | 12/2006 | Sun et al. | |
| 2011/0315961 A1 | 12/2011 | Chen et al. | |
| 2013/0082235 A1 * | 4/2013 | Gu | H01L 27/0688 977/734 |
| 2014/0367857 A1 | 12/2014 | Yang et al. | |
| 2016/0366354 A1 * | 12/2016 | Konstantatos | H01L 27/14643 |
| 2018/0240941 A1 * | 8/2018 | Li | H01L 25/0753 |
| 2019/0326330 A1 * | 10/2019 | Xia | H01L 25/0753 |
| 2020/0243423 A1 * | 7/2020 | Or-Bach | H10B 41/20 |

FOREIGN PATENT DOCUMENTS

| | | |
|---|---|---|
| CN | 107146770 A | 9/2017 |
| CN | 109698133 A | 4/2019 |

* cited by examiner

ARRAY SUBSTRATE, METHOD FOR FABRICATING SAME, AND DISPLAY DEVICE

FIELD OF INVENTION

The present disclosure relates to the technical field of display, and particularly to an array substrate, a method for fabricating the same, and a display device.

BACKGROUND

Miniaturization of light-emitting diodes has developed into one of focuses of future display technology. Compared with current liquid crystal displays (LCDs) and organic light emitting diode (OLED) display devices, it has advantages of fast response, high color gamut, high pixels per inch (PPI), and low energy consumption. However, the miniaturization of light-emitting diodes is difficult and complicated. Especially mass transfer technology and miniaturization of organic light emitting diode (LED) particles, which are its key technologies, have become technical bottlenecks. A mini light-emitting diode (mini-LED) backplane is a combination of miniaturized light-emitting diodes and a backplane. The mini-LED backplane has high contrast and high color rendering performance, which are comparable to organic light emitting diode display devices. Cost of the mini-LED backplane is slightly higher than cost of liquid crystal displays, and is only about 60% of cost of organic light emitting diode display devices. The mini-LED backplane is easier to implement than micro-LEDs and organic light emitting diode display devices. Therefore, mini light-emitting diodes have become a focus in layouts of major panel manufacturers.

Please refer to FIG. 1, which is a schematic diagram of a mini light-emitting diode backlight module in the prior art. The mini light-emitting diode backlight module in the prior art comprises an array layer and a patterned black organic photoresist layer 104. The array layer comprises a thin film transistor 101, a conductive electrode 102 for bonding a mini light-emitting diode, a bonding pin (not shown) for bonding a flip-chip film, and a passivation layer 103 covering the thin film transistor 101 and exposing the conductive electrode 102 and the bonding pin. The patterned black organic photoresist layer 104 is disposed corresponding to the thin film transistor 101. Because patterning of the passivation layer 103 and patterning of the black organic photoresist layer each require a photomask, a number of photomasks used for the mini light-emitting diode backlight module in the prior art is greater.

Therefore, it is necessary to provide a technical solution to reduce a number of photomasks used in a manufacturing process of mini light-emitting diode backlight modules in the prior art.

SUMMARY OF DISCLOSURE

A purpose of the present disclosure is to provide an array substrate, a method for fabricating the same, and a display device, so as to reduce a number of photomasks required for fabricating the array substrate.

To achieve the above purpose, the present disclosure provides a method for fabricating an array substrate. The method comprises:
forming a passivation layer on an array substrate, wherein the array substrate comprises a thin film transistor and a conductive pad, and the passivation layer covers the thin film transistor and the conductive pad;
forming a full-surface carbon film on the passivation layer; and
removing the passivation layer and the carbon film corresponding to the conductive pad by a patterning process to obtain the array substrate.

In an embodiment, the step of removing the passivation layer and the carbon film corresponding to the conductive pad by the patterning process comprises:
forming a photoresist layer on a surface of the carbon film away from the passivation layer;
exposing the photoresist layer with a photomask, and developing the photoresist layer with a developer to obtain a patterned photoresist layer; and
removing the carbon film corresponding to the conductive pad using plasma to react with the carbon film not covered by the patterned photoresist layer.

In an embodiment, the plasma is made of oxygen or hydrogen.

In an embodiment, after the step of removing the carbon film corresponding to the conductive pad, the method further comprises:
removing the passivation layer corresponding to the conductive pad by dry etching.

In an embodiment, the step of forming the full-surface carbon film on the passivation layer comprises:
sputtering graphite as a target material on the passivation layer to form the full-surface carbon film.

In an embodiment, the carbon film has a thickness greater than 100 nm.

An array substrate comprises:
a substrate;
an array layer disposed on the substrate and comprising a thin film transistor and a conductive pad;
a passivation layer covering the thin film transistor and exposing the conductive pad; and
a patterned carbon film disposed on the passivation layer.

In an embodiment, the patterned carbon film has a thickness greater than 100 nm.

In an embodiment, the array substrate further comprises a light-emitting element bonded on the conductive pad.

In an embodiment, the light-emitting element is a mini light-emitting diode or a micro light-emitting diode.

In an embodiment, the patterned carbon film is obtained by reacting at least a part of a full-surface carbon film corresponding to the conductive pad with plasma.

In an embodiment, the plasma is made of oxygen or hydrogen.

A display device comprises an array substrate. The array substrate comprises:
a substrate;
an array layer disposed on the substrate and comprising a thin film transistor and a conductive pad;
a passivation layer covering the thin film transistor and exposing the conductive pad; and
a patterned carbon film disposed on the passivation layer.

In an embodiment, the patterned carbon film has a thickness greater than 100 nm.

In an embodiment, the array substrate further comprises a light-emitting element bonded on the conductive pad.

In an embodiment, the light-emitting element is a mini light-emitting diode or a micro light-emitting diode.

An array substrate, a method for fabricating the same, and a display device are provided. The method comprises: forming a passivation layer on an array substrate, wherein the array substrate comprises a thin film transistor and a conductive pad, and the passivation layer covers the thin film transistor and the conductive pad; forming a full-surface carbon film on the passivation layer; and patterning the carbon film and the passivation layer to remove the passivation layer and the carbon film corresponding to the conductive pad by a patterning process to obtain the array substrate. By using the carbon film as a light-shielding layer and patterning the carbon film and the passivation layer by a patterning process, the present invention can reduce a number of used photomasks, compared with preparation of a black organic layer and preparation of a passivation layer that both require a photomask in the prior art.

DETAILED DESCRIPTION

Technical solutions in embodiments of the present disclosure will be clearly and completely described below in conjunction with accompanying drawings in the embodiments of the present disclosure. Apparently, the described embodiments are merely some of the embodiments of the present disclosure and not all embodiments. All other embodiments obtained by those skilled in the art based on the embodiments of the present disclosure without creative labor are within the claimed scope of the present invention.

Figure 1:
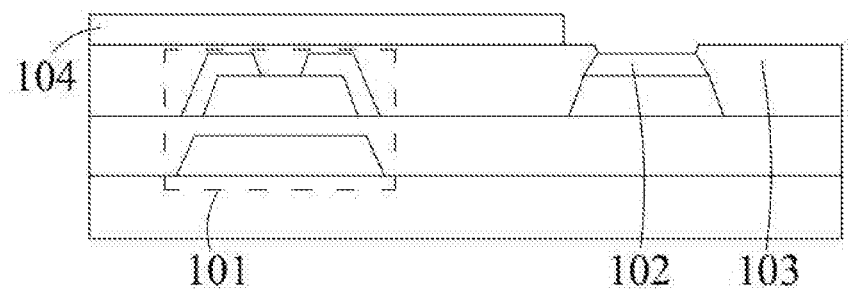
FIG. 1 is a schematic diagram of a mini light-emitting diode backlight module in the prior art.
Figure 2:
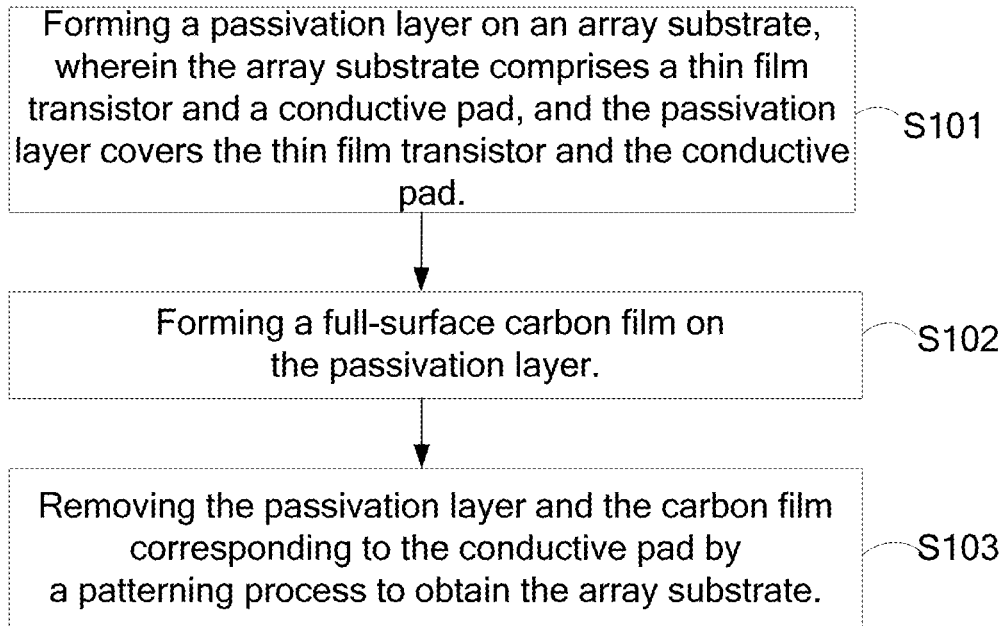
FIG. 2 is a schematic flowchart of a method for fabricating an array substrate according to an embodiment of the present disclosure.

Please refer to FIG. 2, which is a schematic flowchart of a method for fabricating an array substrate according to an embodiment of the present disclosure. The method comprises the following steps.

S101: forming a passivation layer on an array substrate, wherein the array substrate comprises a thin film transistor and a conductive pad, and the passivation layer covers the thin film transistor and the conductive pad.

Specifically, first, the array substrate is provided. The array substrate comprises a substrate and an array layer. The array layer is disposed on the substrate. The array layer comprises a thin film transistor, a conductive pad, and a bonding pin. The thin film transistor is configured as a driving element to control operating state of a light-emitting element bonded on the conductive pad. The bonding pin is configured to bond a flip-chip film. The flip-chip film comprises a flexible film and a driving chip disposed on the flexible film.

Second, the passivation layer covering the array layer is formed by chemical vapor deposition. The passivation layer is made of one or more of silicon nitride and silicon oxide. Specifically, the passivation layer is a silicon nitride layer.

S102: forming a full-surface carbon film on the passivation layer.

Specifically, graphite as a target material is sputtered on the passivation layer to form the full-surface carbon film. Sputtering deposition is physical deposition. Process parameters of sputtering deposition are commonly used parameters and will not be described in detail herein. A process of obtaining the carbon film by physical sputtering deposition is simple. The carbon film has the characteristics of low internal stress, good thermal stability, good compactness, and the like, and can shield the thin film transistor from light.

In this embodiment, the carbon film has a thickness greater than 100 nm to provide a good light-shielding effect. For example, 150 nm, 200 nm, 500 nm, 1000 nm, 1500 nm, and 3000 nm.

S103: removing the passivation layer and the carbon film corresponding to the conductive pad by a patterning process to obtain the array substrate.

Specifically, the passivation layer 205 and the carbon film 206 are patterned by a yellow light process, so that the carbon film 206 can shield the thin film transistor from light and expose the conductive pad 2043 and the bonding pin. The light-emitting element is bonded to the conductive pad. The flip-chip film is bonded to the bonding pin. The light emitting element may be a mini light emitting diode (mini LED), a micro light emitting diode (micro LED) or an organic light emitting diode.

In a method for fabricating an array substrate of the present application, a carbon film is configured as a light-shielding layer, and the carbon film and a passivation layer are patterned using a same photomask. In the prior art, an organic black photoresist layer as a negative photoresist layer requires a separate photomask to achieve patterning. In contrast, the method of the present application realizes light-shielding protection of thin film transistors, and reduces a number of used photomasks.

Figure 3:
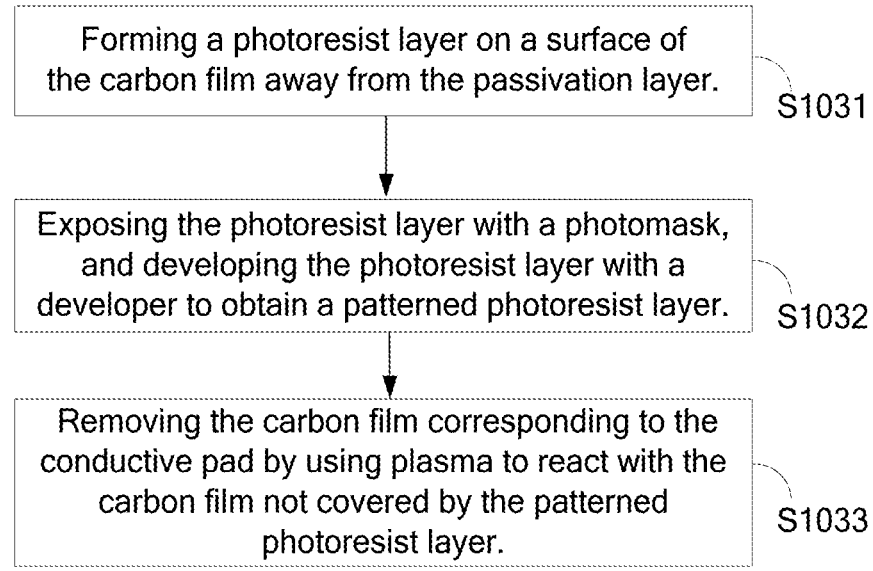
FIG. 3 is a schematic flowchart of removing a passivation layer and a carbon film corresponding to a conductive pad by a patterning process.

Please refer to FIG. 3, which is a schematic flowchart of removing a passivation layer and a carbon film corresponding to a conductive pad by a patterning process. The removing the passivation layer and the carbon film corresponding to the conductive pad comprises the following steps.

S1031: forming a photoresist layer on a surface of the carbon film away from the passivation layer.

Specifically, a positive photoresist layer is formed on the surface of the passivation layer by coating.

S1032: exposing the photoresist layer with a photomask, and developing the photoresist layer with a developer to obtain a patterned photoresist layer.

Specifically, areas of the positive photoresist layer corresponding to the conductive pad and the bonding pin are exposed with a photomask, and then the exposed photoresist layer is developed with a developer to obtain a patterned photoresist layer.

S1033: removing the carbon film corresponding to the conductive pad using plasma to react with the carbon film not covered by the patterned photoresist layer.

Specifically, oxygen or hydrogen is used as a gas source, and oxygen or hydrogen is plasmaized. The carbon film not covered by the patterned photoresist layer reacts with the plasma to generate vaporized hydrocarbons or oxocarbons, so that the carbon film not covered by the patterned photoresist layer is removed. That is, the carbon film corresponding to the conductive pad and the bonding pin is removed. The carbon film covered by the patterned photoresist layer is protected by the patterned photoresist layer.

Then, the passivation layer corresponding to the conductive pad and the bonding pin is removed by dry etching. And, the remaining patterned photoresist layer is removed to obtain the array substrate with the exposed conductive pad and the bonding pin.

The present disclosure further provides an array substrate comprising:

a substrate;

an array layer disposed on the substrate and comprising a thin film transistor and a conductive pad;

a passivation layer covering the thin film transistor and exposing the conductive pad; and a patterned carbon film disposed on the passivation layer.

In this embodiment, the substrate is a glass substrate. The array layer comprises a thin film transistor, a conductive pad, and a bonding pin. The conductive pad and the binding pin are disposed in a same conductive layer.

In this embodiment, the conductive pad is made of one or more of molybdenum, aluminum, titanium, and copper. For example, the bonding pin and the conductive pad are composed of a MoTiNi alloy layer, a copper layer, and a MoTiNi alloy layer stacked in sequence. The MoTiNi alloy layers have a thickness of 300-600 Å. The copper layer has a thickness of 4000-5000 Å.

In this embodiment, the passivation layer is made of one or more of silicon nitride and silicon oxide. The passivation layer has a thickness of 800-6000 Å, for example, 1500 Å, 1000 Å, or 3000 Å.

In this embodiment, the patterned carbon film has a thickness greater than 100 nm, for example, 150 nm, 200 nm, or 350 nm. The patterned carbon film is at least disposed corresponding to the thin film transistor and exposes the conductive pad.

In this embodiment, the array substrate further comprises a light-emitting element bonded on the conductive pad. The light-emitting element is a mini light-emitting diode or a micro light-emitting diode.

In this embodiment, the patterned carbon film is obtained by reacting at least a part of a full-surface carbon film corresponding to the conductive pad with plasma. The plasma is made of oxygen or hydrogen. Plasma bombards the carbon film to generate hydrocarbons or oxocarbons.

The present disclosure further provides a display device comprising a backlight module. The backlight module comprises the above array substrate.

The above solution is described in detail below in conjunction with specific embodiments.

S201: forming an array layer on a substrate.

Specifically, a substrate 200 is provided. A gate electrode 201 is formed on a first region 200a of the substrate 200. The first region 200a is where a thin film transistor is formed. The gate electrode 201 is made of one or more of copper, molybdenum, and aluminum.

A gate insulating layer 202 is formed to cover the gate electrode 201 and the substrate 200. A patterned semiconductor layer is formed on the gate insulating layer 202. The patterned semiconductor layer comprises an active layer 2031 formed in the first region 200a. The gate insulating layer 202 is made of one or more of silicon nitride and silicon oxide. The patterned semiconductor layer may be made of polysilicon, metal oxide, amorphous silicon, or the like.

Figure 4:
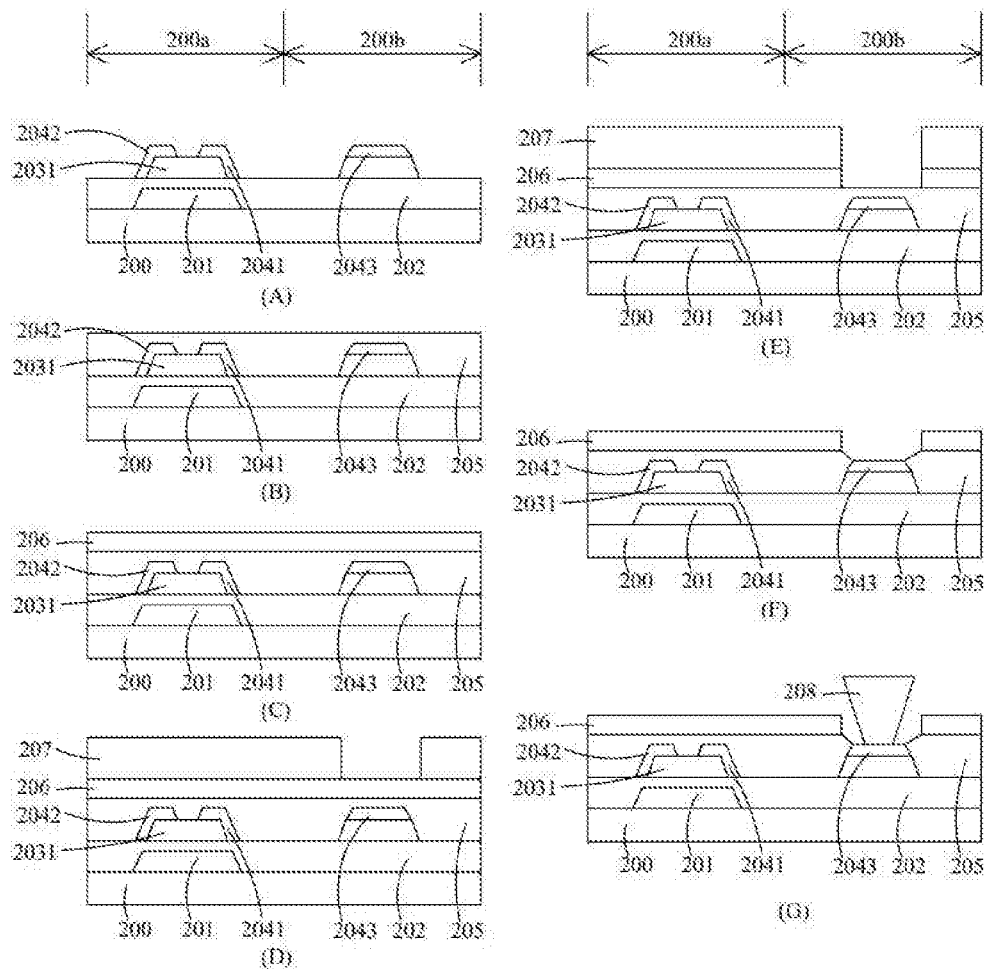
FIG. 4 is a schematic diagram of a fabricating process of the array substrate according to an embodiment of the present disclosure.

A full-surface metal layer is formed, and then the metal layer is patterned to form source and drain electrodes 2041, 2042 in the first region 200a of the substrate 200 and a conductive pad 2043 in a second region 200b, as shown in FIG. 4A. The source and drain electrodes 2041, 2042 and the conductive pad 2043 are formed in a same layer. After the metal layer is patterned, a bonding pin (not shown) is also formed. The second region 200b is located at a side of the first region 200a.

The patterned semiconductor layer, the source and drain electrodes 2041, 2042, and the conductive pad 2043 may be made using a same halftone grayscale mask. For example, a full-surface semiconductor layer and a full-surface metal layer are formed sequentially. A photoresist layer is formed on the metal layer. The photoresist layer is exposed with a halftone grayscale mask to form a photoresist completely retained area, a photoresist partially retained area, and a photoresist completely removed area in the photoresist layer. The metal layer and the semiconductor layer in the photoresist completely removed area are removed to form an active layer, a conductive pad, and a bonding pin. Then, the metal layer in the photoresist partially retained area is partially removed to obtain source and drain electrodes. And, the remaining photoresist layer is removed.

S202: forming a passivation layer on the array layer.

Specifically, as shown in FIG. 4B, a passivation layer 205 is formed by chemical vapor deposition to cover the source and drain electrodes 2041, 2042, the conductive pad 2043, and the gate insulating layer 202. The passivation layer 205 may be a silicon nitride layer, a silicon oxide layer, and a stack of a silicon nitride layer and a silicon oxide layer.

S203: forming a carbon film on the passivation layer.

Specifically, as shown in FIG. 4C, a carbon film 206 is formed on the passivation layer 205 by physical sputtering deposition.

S204: patterning the carbon film and the passivation layer by a patterning process to remove the carbon film and the passivation layer corresponding to the conductive pad, and bonding a mini light-emitting diode to the conductive pad to obtain the array substrate.

As shown in FIG. 4D, a full-surface positive photoresist layer is coated on the carbon film 206. The positive photoresist layer is exposed with a photomask. Then, the exposed positive photoresist layer is developed with a developer to obtain a patterned positive photoresist layer 207. The carbon film 206 corresponding to the conductive pad 2043 is not protected by the positive photoresist layer.

As shown in FIG. 4E, plasma made of oxygen and hydrogen bombards the substrate. The carbon film 206 that is not protected by the patterned photoresist layer reacts with the plasma to generate hydrocarbons and oxocarbons, so that the part of the carbon film 206 corresponding to the conductive pad 2043 is removed. Then, as shown in FIG. 4F, the exposed passivation layer 205 is removed by dry etching, thereby exposing the conductive pad 2043.

As shown in FIG. 4G, a mini light emitting diode 208 is bonded on the conductive pad 2043, and a flip-chip film (not shown) is bonded on a bonding pin (not shown) to obtain an array substrate.

The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A method for fabricating an array substrate, comprising:
providing a substrate;
forming an array layer on the substrate; wherein the array layer comprises a thin film transistor and a conductive pad spaced apart in a direction parallel to the substrate;
forming a passivation layer on the array layer, wherein the passivation layer covers the thin film transistor and the conductive pad;
forming a full-surface carbon film on the passivation layer; and removing the passivation layer and the carbon film corresponding to the conductive pad by a patterning process to obtain the array substrate;
wherein the step of removing the passivation layer and the carbon film corresponding to the conductive pad by the patterning process comprises:
forming a photoresist layer on a surface of the carbon film away from the passivation layer;
patterning the photoresist layer to obtain a patterned photoresist layer with an opening corresponding to the conductive pad;
sequentially removing part of the carbon film and part of the passivation layer corresponding to the opening to expose the conductive pad; wherein the carbon film forms a patterned carbon film covering the thin film transistor, and the patterned carbon film is a light-shielding layer.

2. The method for fabricating the array substrate according to claim 1, wherein the step of forming the full-surface carbon film on the passivation layer comprises:
sputtering graphite as a target material on the passivation layer to form the full-surface carbon film.

3. The method for fabricating the array substrate according to claim 1, wherein the carbon film has a thickness greater than 100 nm.

4. The method for fabricating the array substrate according to claim 1, wherein after the step of sequentially removing part of the carbon film and part of the passivation layer corresponding to the opening, a first opening exposing the conductive pad is formed in the passivation layer, and the carbon film forms a patterned carbon film comprising a second opening, and the second opening is communicating with the first opening;
wherein an opening area of the first opening is equal to an opening area of the second opening.

5. The method for fabricating the array substrate according to claim 1, wherein the conductive pad is disposed in a same layer with a source electrode and a drain electrode of the thin film transistor.

6. The method for fabricating the array substrate according to claim 1, wherein the thin film transistor comprises a patterned semiconductor layer, and a source electrode and a drain electrode disposed on the patterned semiconductor layer away from the substrate, and the conductive pad is disposed in a same layer with the source electrode and the drain electrode;
wherein the patterned semiconductor layer, the source electrode and the drain electrode, and the conductive pad is formed using a same halftone grayscale mask.

7. The method for fabricating the array substrate according to claim 1, wherein the step of patterning the photoresist layer comprises:
exposing the photoresist layer with a photomask, and developing the photoresist layer with a developer to obtain the patterned photoresist layer; and
wherein the step of sequentially removing part of the carbon film and part of the passivation layer corresponding to the opening comprises: removing the carbon film corresponding to the conductive pad using plasma to react with the carbon film not covered by the patterned photoresist layer.

8. The method for fabricating the array substrate according to claim 7, wherein a gas source of the plasma is oxygen and/or hydrogen.

9. The method for fabricating the array substrate according to claim 7, after the step of removing the carbon film corresponding to the conductive pad, further comprising:
removing the passivation layer corresponding to the conductive pad by dry etching.

10. An array substrate, comprising:
a substrate;
an array layer disposed on the substrate and comprising a thin film transistor and a conductive pad, wherein the thin film transistor and the conductive pad are spaced apart in a direction parallel to the substrate;
a passivation layer covering the thin film transistor and exposing the conductive pad; and
a patterned carbon film disposed on the passivation layer and exposing the conductive pad;
wherein the patterned carbon film is disposed on the thin film transistor away from the substrate and covers the thin film transistor, and the patterned carbon film is a light-shielding layer.

11. The array substrate according to claim 10, wherein the patterned carbon film has a thickness greater than 100 nm.

12. The array substrate according to claim 10, wherein the passivation layer comprises a first opening exposing the conductive pad, and the patterned carbon film comprises a second opening communicating with the first opening; and
wherein an opening area of the first opening is equal to an opening area of the second opening.

13. The array substrate according to claim 10, wherein the conductive pad is configured to be bonded with a light-emitting element.

14. The array substrate according to claim 13, wherein the light-emitting element is a mini light-emitting diode or a micro light-emitting diode.

15. A display device, comprising an array substrate, wherein the array substrate comprises:
a substrate;
an array layer disposed on the substrate and comprising a thin film transistor and a conductive pad, wherein the thin film transistor and the conductive pad are spaced apart in a direction parallel to the substrate;
a passivation layer covering the thin film transistor and exposing the conductive pad; and
a patterned carbon film disposed on the passivation layer and exposing the conductive pad;
wherein the patterned carbon film is disposed on the thin film transistor away from the substrate and covers the thin film transistor, and the patterned carbon film is a light-shielding layer.

16. The display device according to claim 15, wherein the patterned carbon film has a thickness greater than 100 nm.

17. The display device according to claim 15, wherein the passivation layer comprises a first opening exposing the conductive pad, and the patterned carbon film comprises a second opening communicating with the first opening; and
wherein an opening area of the first opening is equal to an opening area of the second opening.

18. The display device according to claim 15, wherein the display device further comprises a light-emitting element bonded on the conductive pad.

19. The display device according to claim 18, wherein the light-emitting element is a mini light-emitting diode or a micro light-emitting diode.

* * * * *